(12) United States Patent
Masuko et al.

(10) Patent No.: US 8,349,700 B2
(45) Date of Patent: Jan. 8, 2013

(54) PHOTOSENSITIVE ADHESIVE, SEMICONDUCTOR DEVICE AND METHOD FOR MANUFACTURING SEMICONDUCTOR DEVICE

(75) Inventors: Takashi Masuko, Tsukuba (JP); Takashi Kawamori, Tsukuba (JP); Kazuyuki Mitsukura, Tsukuba (JP); Shigeki Katogi, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 259 days.

(21) Appl. No.: 12/745,594

(22) PCT Filed: Dec. 2, 2008

(86) PCT No.: PCT/JP2008/071883
§ 371 (c)(1),
(2), (4) Date: Oct. 26, 2010

(87) PCT Pub. No.: WO2009/072493
PCT Pub. Date: Jun. 11, 2009

(65) Prior Publication Data
US 2011/0031631 A1    Feb. 10, 2011

(30) Foreign Application Priority Data
Dec. 4, 2007    (JP) ................................. P2007-313906

(51) Int. Cl.
*H01L 21/30* (2006.01)
(52) U.S. Cl. ................................. 438/455; 257/E21.596
(58) Field of Classification Search .................. 438/455, 438/458–460, 463–465; 257/E21.505, E21.595, 257/E21.596
See application file for complete search history.

(56) References Cited

U.S. PATENT DOCUMENTS

| | | | |
|---|---|---|---|
| 5,447,767 A * | 9/1995 | Tanabe et al. | ............... 428/64.4 |
| 5,677,393 A | 10/1997 | Ohmori et al. | |
| 7,250,310 B1 | 7/2007 | Weaver et al. | |
| 2007/0045836 A1 | 3/2007 | Kwon et al. | |

FOREIGN PATENT DOCUMENTS

| | | |
|---|---|---|
| JP | 10-27827 | 1/1998 |
| JP | 11-024257 | 1/1999 |
| JP | 2000-290501 | 10/2000 |
| JP | 2001-329233 | 11/2001 |
| JP | 2004-022996 | 1/2004 |
| JP | 2007/004569 | 1/2007 |

(Continued)

OTHER PUBLICATIONS

Office Action issued in co-pending related matter U.S. Appl. No. 12/745,592 on Apr. 29, 2011.

(Continued)

*Primary Examiner* — David Vu
(74) *Attorney, Agent, or Firm* — Griffin & Szipl, P.C.

(57) ABSTRACT

A method for manufacturing a semiconductor device 1, comprising a first step of providing a photosensitive adhesive (insulating resin layer 7) on a board 3 which has a connecting terminal, a second step of patterning the photosensitive adhesive by light exposure and development so that openings 13 are formed where the connecting terminal is exposed, a third step of filling the openings 13 with a conductive material to form a conductive layer 9, and a fourth step of directly bonding a semiconductor chip 5 having a connecting electrode section to the photosensitive adhesive while electrically connecting the connecting terminal of the board 3 and the connecting electrode section of the semiconductor chip 5 via the conductive layer 9.

10 Claims, 7 Drawing Sheets

FOREIGN PATENT DOCUMENTS

| | | |
|---|---|---|
| JP | 3999840 | 8/2007 |
| TW | 200415749 | 8/2004 |
| WO | 2004/070826 A1 | 8/2004 |
| WO | 2007/004569 A1 | 1/2007 |

OTHER PUBLICATIONS

WO 2007004569 A1 Derwent Summary in English.
Office Action issued on Jun. 4, 2012 in a related Taiwanese application 097147133 (no translation available; submitted for certification).
International Search Report issued in corresponding application No. PCT/JP2008/071883, completed Feb. 20, 2009 and mailed Mar. 3, 2009.
English translation of the International Preliminary Report on Patentability issued in corresponding application No. PCT/JP2008/071883.
English translation of the International Preliminary Report on Patentability issued in related application No. PCT/JP2008/071882.
Office action issued in co-pending related U.S. Appl. No. 12/745,592 on Oct. 27, 2011.
Office Action issued in corresponding Chinese patent application 200880117162.6 on Oct. 25, 2011 (no translation available; submitted for certification).

* cited by examiner

PHOTOSENSITIVE ADHESIVE, SEMICONDUCTOR DEVICE AND METHOD FOR MANUFACTURING SEMICONDUCTOR DEVICE

This is a National Phase Application in the United States of International Patent Application No. PCT/JP2008/071883 filed Dec. 2, 2008, which claims priority on Japanese Patent Application No. P2007-313906, filed Dec. 4, 2007. The entire disclosures of the above patent applications are hereby incorporated by reference.

TECHNICAL FIELD

The present invention relates to a photosensitive adhesive, a semiconductor device and a method for manufacturing a semiconductor device.

BACKGROUND ART

Flip-chip mounting systems, in which a board and a semiconductor chip are connected via a plurality of conductive bumps, are a subject of interest in the field of semiconductor packaging. In a flip-chip mounting system, stress arising from the difference in thermal expansion coefficients of the board and semiconductor chip can cause connection defects between the board and semiconductor chip through the conductive bumps. Systems are known for sealing conductive bumps by filling a resin between the board and semiconductor chip, in order to alleviate the stress (Patent document 1, for example).

In the method for manufacturing a semiconductor device described in Patent document 1, a plurality of conductive bumps and a resin sheet composed of a resin with electrical insulating properties are situated between the mutually opposing board and semiconductor chip. The resin sheet is melted by heat and pressure to seal the plurality of bumps between the board and semiconductor chip by the resin.
[Patent document 1] Japanese Patent No. 3999840

DISCLOSURE OF THE INVENTION

Problems to be Solved by the Invention

In conventional flip-chip mounting systems, however, the resin often seeps into the area between the connecting terminals on the board and the conductive bumps and between the semiconductor chip and the conductive bumps. As a result, conduction between the board and semiconductor chip through the conductive bumps has been inhibited and the connection reliability has been reduced.

It is therefore an object of the present invention to inhibit reduction in connection reliability between connecting terminals via conductive bumps.

Means for Solving the Problems

The method for manufacturing a semiconductor device according to the invention comprises a first step of providing a photosensitive adhesive on a first adherend having a first connection section, a second step of patterning the photosensitive adhesive by light exposure and development so that openings are formed where the first connection section is exposed, a third step of filling the openings with a conductive material to form a conductive layer, and a fourth step of directly bonding a second adherend having a second connection section to the photosensitive adhesive while electrically connecting the first connection section and second connection section by the conductive layer.

In the method for manufacturing a semiconductor device according to the invention, openings for exposure of the first connection section are formed using a photosensitive adhesive provided with a photosensitive resin which has a function to form a patterned insulating resin layer, and the openings are filled with a conductive material. This allows an insulating resin layer made of a photosensitive adhesive to be formed without seepage of the resin between the first adherend and conductive layer, so that conduction between the first adherend and conductive layer can be ensured to inhibit reduction in connection reliability between the first adherend and conductive layer.

In the method for manufacturing a semiconductor device according to the invention, either the first adherend or second adherend is a semiconductor wafer composed of a plurality of semiconductor chips while the other is a board, and either between the third step and fourth step or after the fourth step, an additional dicing step may be provided in which the semiconductor wafer is diced into the semiconductor chips.

In the method for manufacturing a semiconductor device according to the invention, a photosensitive adhesive with adhesion for the second adherend is used after it has been patterned. Thus, the photosensitive adhesive preferably contains an alkali-soluble polymer, a radiation-polymerizable compound and a photopolymerization initiator, since it will thus be possible to very easily impart adhesion for the second adherend to the patterned photosensitive adhesive. From the same viewpoint, the alkali-soluble polymer more preferably contains a carboxyl or phenolic hydroxyl group.

The glass transition temperature of the alkali-soluble polymer is preferably not greater than 150° C. This allows the photosensitive adhesive to be attached to the second adherend at a lower temperature.

The alkali-soluble polymer is preferably a polyimide. The polyimide is preferably one obtained by reacting a tetracarboxylic dianhydride with a diamine including at least one type of aromatic diamine represented by any of the following chemical formulas (I-a), (I-b), (II-a), (II-b) and (II-c).

[Chemical Formula 1]

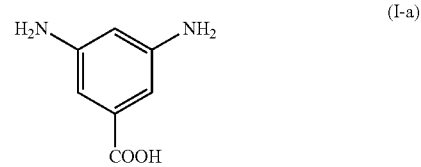

(I-a)

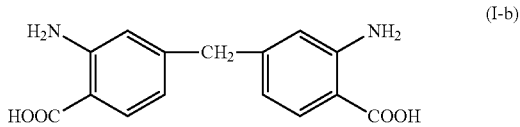

(I-b)

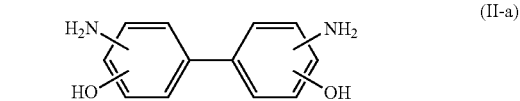

(II-a)

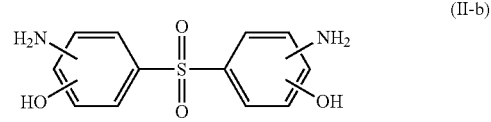

(II-b)

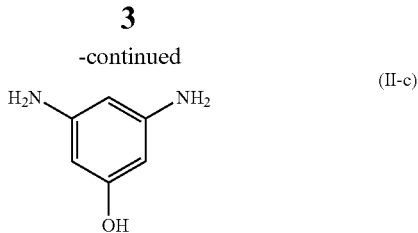

(II-c)

In the method for manufacturing a semiconductor device according to the invention, the photosensitive adhesive preferably further contains a thermosetting resin.

Also, the photosensitive adhesive used in the method for manufacturing a semiconductor device according to the invention may be in the form of a film.

The semiconductor device of the invention is obtained by the method for manufacturing a semiconductor device described above.

Effect of the Invention

According to the invention it is possible to inhibit reduction in connection reliability between connecting terminals via conductive bumps. Also according to the invention, it is possible to inhibit generation of voids due to entrainment of air produced during filling of a resin, since it is not necessary to form the insulating resin layer by filling the resin.

EXPLANATION OF SYMBOLS

1: Semiconductor device, 3: board (first adherend), 5: semiconductor chip (second adherend), 7: insulating resin layer, 9: conductive layer, 11: circuit surface, 13: opening, 17: semiconductor wafer.

BEST MODE FOR CARRYING OUT THE INVENTION

Preferred embodiments of the invention will now be described in detail. However, the present invention is not limited to the embodiments described below.

Figure 1:
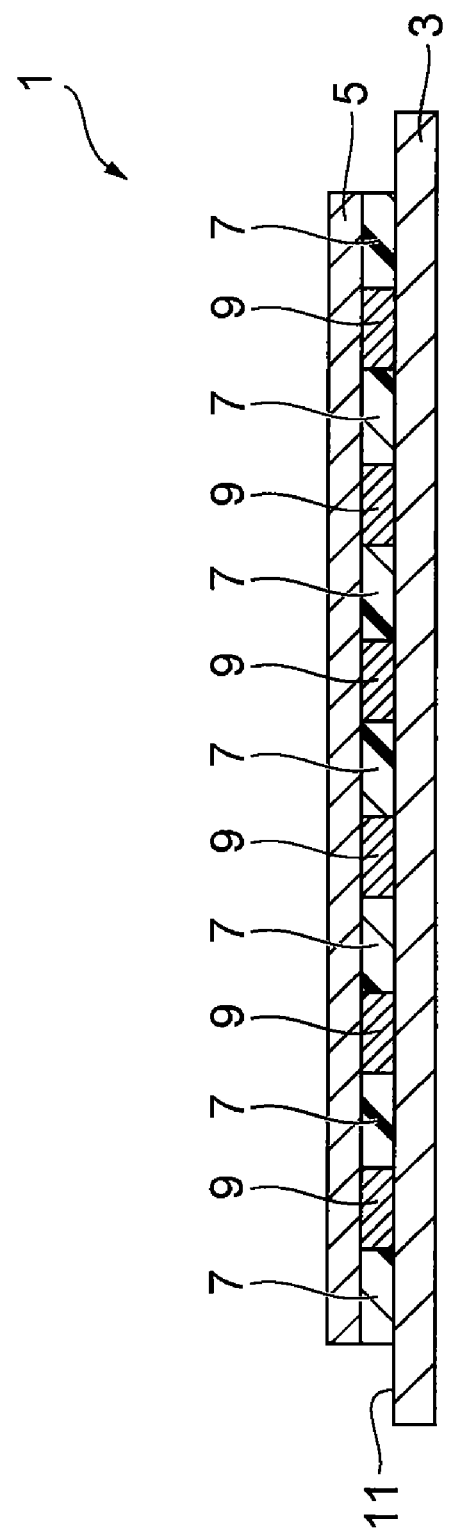
FIG. 1 is a cross-sectional view showing an embodiment of a semiconductor device.

FIG. 1 is a cross-sectional view showing an embodiment of a semiconductor device. The semiconductor device 1 comprises a board (first adherend) 3 with a connecting terminal (first connection section: not shown), a semiconductor chip (second adherend) 5 with a connecting electrode section (second connection section: not shown), an insulating resin layer 7 made of a photosensitive adhesive and a conductive layer 9 made of a conductive material. The board 3 has a circuit surface 11 opposing the semiconductor chip 5, and it is situated at a prescribed spacing from the semiconductor chip 5. The insulating resin layer 7 is formed between the board 3 and semiconductor chip 5 in contact with both the board 3 and semiconductor chip 5, and it has a prescribed pattern. The conductive layer 9 is formed at the section where the insulating resin layer 7 is not present between the board 3 and semiconductor chip 5. The connecting electrode section of the semiconductor chip 5 is electrically connected to the connecting terminal of the board 3 via the conductive layer 9.

Figure 2:
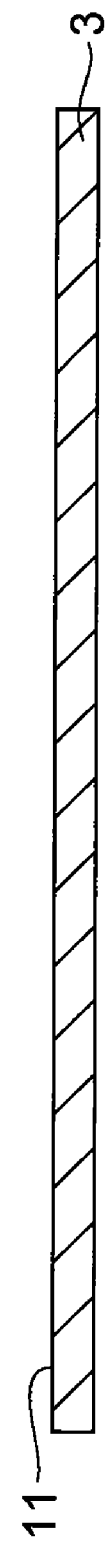
FIG. 2 is a cross-sectional view showing an embodiment of a method for manufacturing a semiconductor device.
Figure 3:
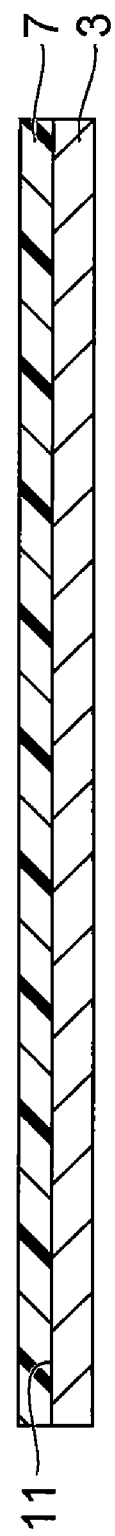
FIG. 3 is a cross-sectional view showing an embodiment of a method for manufacturing a semiconductor device.
Figure 4:
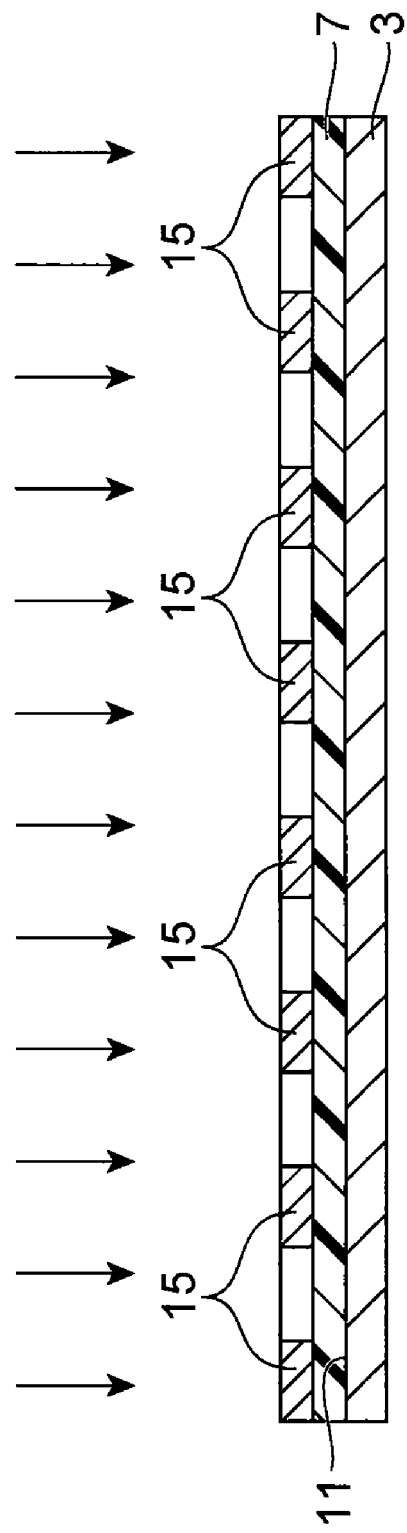
FIG. 4 is a cross-sectional view showing an embodiment of a method for manufacturing a semiconductor device.
Figure 5:
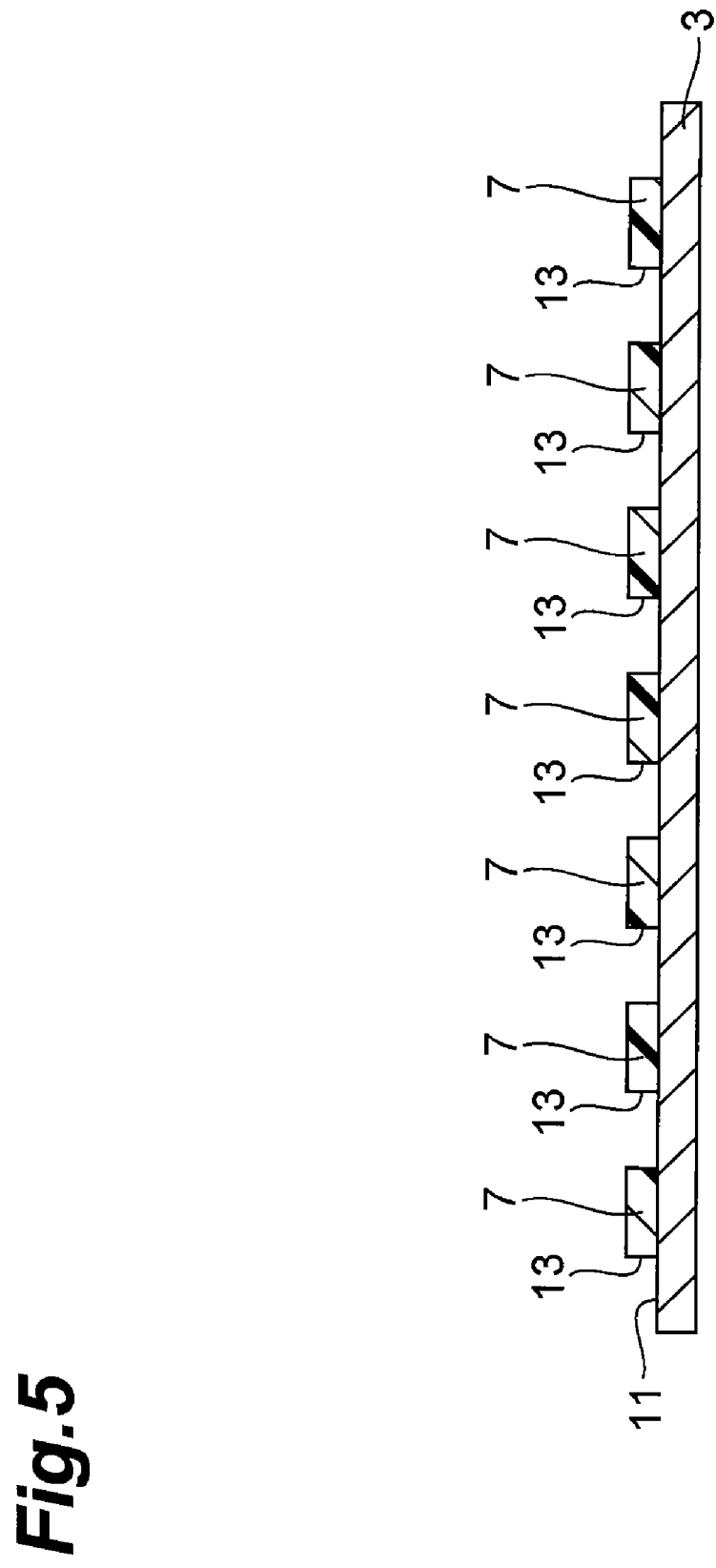
FIG. 5 is a cross-sectional view showing an embodiment of a method for manufacturing a semiconductor device.
Figure 6:
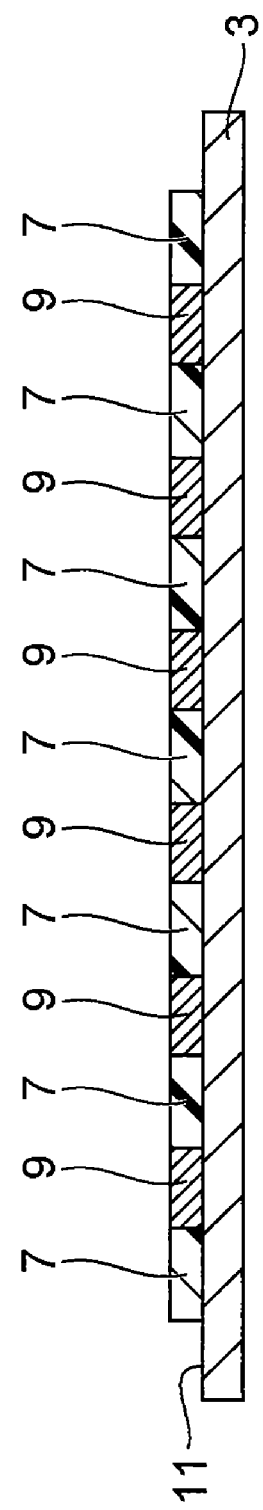
FIG. 6 is a cross-sectional view showing an embodiment of a method for manufacturing a semiconductor device.

FIGS. 2 to 6 are cross-sectional views of an embodiment of a method for manufacturing a semiconductor device. The method for manufacturing a semiconductor device according to this embodiment comprises a step of forming an insulating resin layer 7 made of a photosensitive adhesive on a board 3 having a connecting terminal (first step: FIG. 2 and FIG. 3), a step of patterning the insulating resin layer 7 by light exposure and development so that openings 13 are formed where the connecting terminal is exposed (second step: FIG. 4 and FIG. 5), a step of filling a conductive material into the openings 13 to form a conductive layer 9 (third step: FIG. 6), and a step of directly bonding a semiconductor chip 5 having a connecting electrode section to the insulating resin layer 7 of the laminated body comprising the board 3 and insulating resin layer 7, while electrically connecting the connecting terminal of the board 3 to the connecting electrode section of the semiconductor chip 5 via the conductive layer 9 (fourth step).

The circuit surface 11 of the board 3 shown in FIG. 2 is provided with an insulating resin layer 7 made of a photosensitive adhesive (FIG. 3). A method of preparing the photosensitive adhesive preformed into a film (also referred hereunder as "adhesive film") and attaching it onto the board 3 is convenient. The photosensitive adhesive may be formed by a method of coating a liquid varnish containing the photosensitive adhesive onto a board 2 by a spin coating method, and heating it to dryness.

The photosensitive adhesive is a negative-type photosensitive adhesive capable of alkali development, that exhibits adhesion for the adherend after it has been patterned by light exposure and development. More specifically, the resist pattern formed by patterning of the photosensitive adhesive by light exposure and development exhibits adhesion for adherends, such as the semiconductor chip and board. For example, by pressure bonding the adherends onto the resist pattern with heating if necessary, it is possible to bond the resist pattern and the adherends. The details regarding a photosensitive adhesive with such a function will be explained below.

The insulating resin layer 7 formed on the board 3 is irradiated with active light rays (typically ultraviolet rays) through a mask 15 having openings formed at prescribed locations (FIG. 4). The insulating resin layer 7 is thus exposed to light in the prescribed pattern.

Following light exposure, the sections of the insulating resin layer 7 that were not exposed to light are removed by development using an alkali developing solution, so that the insulating resin layer 7 is patterned in a manner such that openings 13 are formed where the connecting terminal of the board 3 is exposed (FIG. 5). A positive photosensitive adhesive may be used instead of a negative one, in which case the sections of the insulating resin layer 7 exposed to light are removed by development.

A conductive material is filled into the openings 13 of the obtained resist pattern to form a conductive layer 9 (FIG. 6). The method of filling the conductive material may be gravure printing, indenting with a roll, or pressure reduction filling. The conductive material used may contain an electrode material made of a metal such as solder, gold, silver, nickel, copper, platinum, palladium or ruthenium oxide, or a metal oxide, and it may also contain bumps of such metals or, for example, the substance including at least conductive particles and a resin component. The conductive particles may be, for example, conductive particles made of a metal or metal oxide of gold, silver, nickel, copper, platinum, palladium or ruthenium oxide, or an organometallic compound. As resin components there may be used a curable resin composition comprising an epoxy resin and its curing agent, for example.

The semiconductor chip 5 is directly bonded to the insulating resin layer 7 on the board 3. The connecting electrode section of the semiconductor chip 5 is electrically connected to the connecting terminal of the board 3 via the conductive layer 9. A patterned insulating resin layer (buffer coat film) may be formed on the circuit surface of the semiconductor chip 5 opposite to the insulating resin layer 7 side.

Bonding of the semiconductor chip 5 is accomplished by, for example, a method of thermocompression bonding while heating to a temperature at which the photosensitive adhesive exhibits fluidity.

After thermocompression bonding, the insulating resin layer 7 is heated if necessary to further promote curing.

A back side protective film is preferably attached to the circuit surface (back side) of the semiconductor chip 5 opposite to the insulating resin layer 7 side.

A semiconductor device 1 having the construction shown in FIG. 1 is thus obtained. The method for manufacturing a semiconductor device is not limited to the embodiments described above, and it may incorporate appropriate modifications that still fall within the gist of the invention.

For example, the photosensitive adhesive is not limited to being formed first on the board 3, and may be formed first on the semiconductor chip 5. In this case, the method for manufacturing a semiconductor device comprises, for example, a first step of forming an insulating resin layer 7 made of a photosensitive adhesive on a semiconductor chip 5 having a connecting electrode section, a second step of patterning the insulating resin layer 7 by light exposure and development so that openings 13 are formed where the connecting electrode section is exposed, a third step of filling the conductive material into the openings 13 to form a conductive layer 9, and a fourth step of directly bonding a board 3 having a connecting terminal to the insulating resin layer 7 of the laminated body comprising the semiconductor chip 5 and insulating resin layer 7, while electrically connecting the connecting terminal of the board 3 and the connecting electrode section of the semiconductor chip 5 via the conductive layer 9.

In this manufacturing method, connection is between the individuated board 3 and semiconductor chip 5, and it is therefore preferred from the viewpoint of facilitating connection between the connecting terminal on the board 3 and the connecting electrode section on the semiconductor chip 5.

Figure 7:
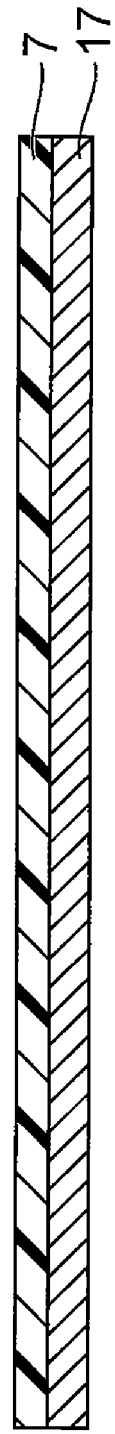
FIG. 7 is a cross-sectional view showing another embodiment of a method for manufacturing a semiconductor device.

The photosensitive adhesive may also be formed first on a semiconductor wafer composed of a plurality of semiconductor chips 5. In this case, the method for manufacturing a semiconductor device comprises, for example, a first step of forming an insulating resin layer 7 made of a photosensitive adhesive on a semiconductor wafer 17 composed of a plurality of semiconductor chips 5 having a connecting electrode sections (FIG. 7), a second step of patterning the insulating resin layer 7 by light exposure and development so that openings 13 are formed where the connecting electrode section is exposed, a third step of filling the openings 13 with a conductive material to form a conductive layer 9, a fourth step of directly bonding a wafer-size board having a connecting terminal (a board having approximately the same size as a semiconductor wafer) 3 onto the insulating resin layer 7 of the laminated body comprising the semiconductor wafer 17 and insulating resin layer 7, while electrically connecting the connecting terminal of the board 3 and the connecting electrode section of the semiconductor chip 5 composing the semiconductor wafer 17, via the conductive layer 9, and a fifth step of dicing the laminated body of the semiconductor wafer 17, insulating resin layer 7 and board 3 into semiconductor chips 5.

In this manufacturing method, an insulating resin layer 7 made of a photosensitive adhesive is provided on a wafer-size board 3 in the first step, a semiconductor wafer 17 is directly bonded to the insulating resin layer 7 of the laminated body comprising the board 3 and insulating resin layer 7 while electrically connecting the connecting terminal of the board 3 and the connecting electrode section of the semiconductor chip 5 composing the semiconductor wafer 17 via the conductive layer 9 in the fourth step, and the laminated body comprising the semiconductor wafer 17, insulating resin layer 7 and board 3 is diced into semiconductor chips 5 in the fifth step.

The step up to connection of the semiconductor wafer 17 and board 3 (fourth step) in this production method are preferred from the viewpoint of working efficiency because they can be carried out with a wafer size. A back side protective film is preferably attached to the circuit surface (back side) of the semiconductor wafer 17 opposite to the insulating resin layer 7 side.

Another method for manufacturing a semiconductor device comprises a first step of forming an insulating resin layer 7 made of a photosensitive adhesive on a semiconductor wafer 17 composed of a plurality of semiconductor chips 5 having connecting electrode sections, a second step of patterning the insulating resin layer 7 by light exposure and development so that openings 13 are formed where the connecting electrode sections are exposed, a third step of filling the conductive material into the openings 13 to form a conductive layer 9, a fourth step of dicing the laminated body comprising the semiconductor wafer 17 and insulating resin layer 7 into semiconductor chips 5, and a fifth step of directly bonding a board 3 having a connecting terminal to the insulating resin layer 7 of the laminated body comprising the individuated semiconductor chips 5 and insulating resin layer 7, while electrically connecting the connecting terminal of the board 3 and the connecting electrode sections of the semiconductor chips 5 via the conductive layer 9.

In this manufacturing method, an insulating resin layer 7 made of a photosensitive adhesive may be provided on a wafer-size board 3 in the first step, the laminated body comprising the wafer-size board 3 and insulating resin layer 7 may be diced into semiconductor chips 5 in the fourth step, and the semiconductor chips 5 may be directly bonded to the insulating resin layer 7 of the laminated body comprising the individuated board 3 and insulating resin layer 7 while electrically connecting the connecting terminal of the board 3 and the connecting electrode sections of the semiconductor chips 5 via the conductive layer 9 in the fifth step.

This manufacturing method is preferred in that the steps from formation of the photosensitive adhesive to filling of the conductive material (third step) are carried out with a wafer size, and the dicing step (fourth step) can be accomplished smoothly.

The photosensitive adhesive may be used to bond together semiconductor wafers or semiconductor chips to form a semiconductor laminated body. Through electrodes may also be formed in the laminated body.

In this case, the method for manufacturing a semiconductor device comprises, for example, a first step of forming an insulating resin layer 7 made of a photosensitive adhesive on a first semiconductor chip 5 having a through electrode-connecting electrode section, a second step of patterning the insulating resin layer 7 by light exposure and development so that openings 13 are formed where the connecting electrode section is exposed, a third step of filling the conductive material into the openings 13 to form through electrode connections, and a fourth step of directly bonding a second semiconductor chip 5 having a connecting electrode section to the insulating resin layer 7 of the laminated body comprising the first semiconductor chip 5 and insulating resin layer 7, while electrically connecting together the connecting electrode sections of the first and second semiconductor chips 5 via a conductive layer 9. A semiconductor wafer may be used instead of a semiconductor chip in this manufacturing method.

A preferred embodiment of a photosensitive adhesive used in the method for manufacturing a semiconductor device according to the embodiment described above will now be explained.

The photosensitive adhesive of this embodiment contains an alkali-soluble polymer, a radiation-polymerizable compound and a photopolymerization initiator.

The alkali-soluble polymer need only be soluble in alkali developing solutions, but it is preferably soluble in tetramethylammonium hydride aqueous solution. Most polymers with carboxyl and/or phenolic hydroxyl groups, for example, have good solubility in alkali developing solutions.

In order to ensure satisfactory adhesion after light exposure, the glass transition temperature (Tg) of the alkali-soluble polymer is preferably 10-150° C. If the Tg of the alkali-soluble polymer is below 10° C., voids will tend to be produced more easily during thermocompression bonding after light exposure. If the Tg is above 150° C., the temperature for attachment onto the adherend before light exposure and the contact bonding temperature after light exposure will be increased, tending to result in warping due to thermal damage or thermal stress on peripheral members. The Tg is the tan δ peak temperature when temperature changes in the viscoelasticity of the photosensitive adhesive film are measured using a viscoelasticity measuring apparatus (by Rheometrix).

The weight-average molecular weight of the alkali-soluble polymer is preferably 5000-150000, more preferably 10000-100000 and even more preferably 10000-50000. If the weight-average molecular weight of the alkali-soluble polymer is less than 5000, the film formability of the photosensitive adhesive will tend to be reduced, while if it is greater than 150000, the solubility in alkali developing solutions will tend to be lower and the developing time lengthened. A weight-average molecular weight of 5000-150000 for the alkali-soluble polymer will produce an effect that allows satisfactory hot flow properties to be ensured for re-adhesion after light exposure. The weight-average molecular weight referred to above is the value based on standard polystyrene, measured using high-performance liquid chromatography (for example, "C-R4A", trade name of Shimadzu Corp.).

The alkali-soluble polymer may also contain a radiation-polymerizable functional group such as an ethylenic unsaturated group. This will allow the alkali-soluble polymer to also function as a radiation-polymerizable compound. Radiation-polymerizable compounds may include only alkali-soluble polymers with radiation-polymerizable functional groups, but it may include combinations of such alkali-soluble polymers with different radiation-polymerizable compounds.

An alkali-soluble polymer used is preferably one containing one or more polymers selected from the group consisting of polyimides, polyamideimides, polyamides, polybenzooxazoles, acrylic polymers, styrene-maleic acid copolymers, vinyl compound-maleimide compound copolymers, novolac resins and polynorbornane resins. Polyimides, polyamideimides, polyamides, polybenzooxazoles and acrylic polymers are preferred among these.

A polyimide used as an alkali-soluble polymer is composed of one or more polymers having an imide backbone in the main chain. The polyimide preferably has a carboxyl and/or phenolic hydroxyl group.

A polyimide with a carboxyl group can be obtained by reacting trimellitic anhydride, and/or a tetracarboxylic dianhydride, with a diamine containing carboxyl and amino groups. A polyimide with a phenolic hydroxyl group can be obtained by reacting a tetracarboxylic dianhydride with a diamine containing phenolic hydroxyl and amino groups. Such reaction will introduce the carboxyl or phenolic hydroxyl group of the diamine into the polyimide. The type of diamine and its charging ratio and the reaction conditions may be appropriately adjusted to control the acid value of the polyimide to the desired range.

The reaction between the tetracarboxylic dianhydride and diamine (condensation reaction) may be carried out by a method known to those skilled in the art. In the reaction, for example, first the tetracarboxylic dianhydride and diamine are subjected to addition reaction in an organic solvent at an equimolar ratio or approximately equimolar ratio, at a reaction temperature of not greater than 80° C. and preferably 0-60° C. The components may be added in any desired order. The viscosity of the reaction mixture will gradually increase as the reaction proceeds, forming polyamide acid as the polyimide precursor. The produced polyamide acid is heated to a temperature of 50-80° C. for depolymerization to adjust the molecular weight. The produced polyamide acid is then subjected to dehydrating cyclization to yield a polyimide. Dehydrating cyclization can be accomplished by thermal cyclization using heat treatment or by chemical cyclization using a dehydrating agent.

More specifically, the charging ratio of the tetracarboxylic dianhydride and diamine is the total amount of preferably 0.5-2.0 mol and more preferably 0.8-1.0 mol for the diamine with respect to 1.0 mol as the total amount of tetracarboxylic dianhydride. If the diamine ratio exceeds 2.0 mol, more polyimide oligomers with terminal amino groups will tend to be generated, while if it is below 0.5 mol, more polyimide oligomers with terminal carboxylic acid or acid anhydride groups will tend to be generated. An increased proportion of such polyimide oligomers will lower the weight-average molecular weight of the polyimide and tend to impair the properties including the heat resistance of the photosensitive adhesive composition. Regulation of the charging ratio will allow the weight-average molecular weight of the polyimide to be adjusted to within 5000-150000.

The diamine used for synthesis of the polyimide is preferably at least one aromatic diamine represented by formula (I-a), (I-b), (II-a), (II-b) or (II-c) above, for particularly satisfactory solubility in alkali developing solutions.

In order to lower the Tg of the polyimide to reduce thermal stress, the diamine preferably comprises an aliphatic etherdiamine represented by the following general formula (III). In formula (III), $Q^1$, $Q^2$ and $Q^3$ each independently represent a C1-10 alkylene group, and $n_1$ represents an integer of 1-80.

[Chemical Formula 2]

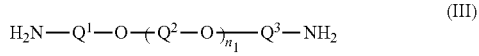
(III)

As aliphatic etherdiamines of formula (III) there may be mentioned, more specifically, compounds represented by following chemical formula (IIIa), (IIIb) and (IIIc). Of these, aliphatic etherdiamines of formula (IIIa) are preferred from the standpoint of increasing the attachment property at low temperature before light exposure and the re-adhesion property after light exposure.

[Chemical Formula 3]

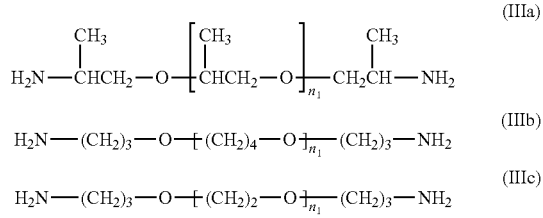
(IIIa)
(IIIb)
(IIIc)

As examples of commercially available aliphatic etherdiamines there may be mentioned JEFFAMINE D-230, D-400, D-2000, D-4000, ED-600, ED-900, ED-2001 and EDR-148 (all trade names) by San Techno Chemical Co., Ltd., and Polyetheramine D-230, D-400 and D-2000 (all trade names) by BASF.

In order to ensure satisfactory adhesion to adherends after light exposure, it is preferred to use a siloxanediamine represented by the following general formula (IV). In formula (IV), $R^1$ and $R^2$ each independently represent a C1-5 alkylene or optionally substituted phenylene group, $R^3$, $R^4$, $R^5$ and $R^6$ each independently represent a C1-5 alkyl, phenyl or phenoxy group, and $n_2$ represents an integer of 1-5.

[Chemical Formula 4]

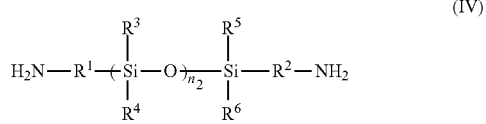
(IV)

As examples of siloxanediamines represented by chemical formula (IV), where $n_2$ is 1, there may be mentioned 1,1,3,3-tetramethyl-1,3-bis(4-aminophenyl)disiloxane, 1,1,3,3-tetraphenoxy-1,3-bis(4-aminoethyl)disiloxane, 1,1,3,3-tetraphenyl-1,3-bis(2-aminoethyl)disiloxane, 1,1,3,3-tetraphenyl-1,3-bis(3-aminopropyl)disiloxane, 1,1,3,3-tetramethyl-1,3-bis(2-aminoethyl)disiloxane, 1,1,3,3-tetramethyl-1,3-bis(3-aminopropyl)disiloxane, 1,1,3,3-tetramethyl-1,3-bis(3-aminobutyl)disiloxane and 1,3-dimethyl-1,3-dimethoxy-1,3-bis(4-aminobutyl)disiloxane.

As examples where $n_2$ is 2, there may be mentioned 1,1,3,3,5,5-hexamethyl-1,5-bis(4-aminophenyl)trisiloxane, 1,1,5,5-tetraphenyl-3,3-dimethyl-1,5-bis(3-aminopropyl)trisiloxane, 1,1,5,5-tetraphenyl-3,3-dimethoxy-1,5-bis(4-aminobutyl)trisiloxane, 1,1,5,5-tetraphenyl-3,3-dimethoxy-1,5-bis(5-aminopentyl)trisiloxane, 1,1,5,5-tetramethyl-3,3-dimethoxy-1,5-bis(2-aminoethyl)trisiloxane, 1,1,5,5-tetramethyl-3,3-dimethoxy-1,5-bis(4-aminobutyl) trisiloxane, 1,1,5,5-tetramethyl-3,3-dimethoxy-1,5-bis(5-aminopentyl)trisiloxane, 1,1,3,3,5,5-hexamethyl-1,5-bis(3-aminopropyl)trisiloxane, 1,1,3,3,5,5-hexaethyl-1,5-bis(3-aminopropyl)trisiloxane and 1,1,3,3,5,5-hexapropyl-1,5-bis(3-aminopropyl)trisiloxane.

These diamines may be used alone or in combinations of two or more. For example, preferably at least one aromatic diamine represented by formula (Ia), (Ib), (II-a), (II-b) or (II-c) is used at 10-50 mol % of the total diamines, a siloxanediamine represented by general formula (IV) is used at 1-20 mol % (even more preferably 5-10 mol %) of the total diamines, and an aliphatic etherdiamine represented by general formula (III) is used at 10-90 mol % of the total diamines. An aromatic diamine represented by formula (Ia) or (Ib) may be used in this proportion to ensure a satisfactory developing property. If the siloxanediamine is used at less than 1 mol % of the total diamines, the adhesion for adherends after light exposure will tend to be reduced, and if it exceeds 20 mol %, the solubility in alkali developing solutions will tend to be reduced. If the aliphatic etherdiamine is used at less than 10 mol % of the total diamines, the Tg of the polyimide will be increased and the low-temperature workability (attachment property at low temperature) will tend to be reduced, while if it exceeds 90 mol %, voids will tend to be generated more easily due to excess flow during thermocompression bonding after light exposure.

The diamine component may further include a diamine other than those mentioned above. As examples there may be mentioned o-phenylenediamine, m-phenylenediamine, p-phenylenediamine, 3,3'-diaminodiphenyl ether, 3,4'-diaminodiphenyl ether, 4,4'-diaminodiphenyl ether, 3,3'-diaminodiphenylmethane, 3,4'-diaminodiphenylmethane, 4,4'-diaminodiphenylethermethane, bis(4-amino-3,5-dimethylphenyl)methane, bis(4-amino-3,5-diisopropylphenyl)methane, 3,3'-diaminodiphenyldifluoromethane, 3,4'-diaminodiphenyldifluoromethane, 4,4'-diaminodiphenyldifluoromethane, 3,3'-diaminodiphenylsulfone, 3,4'-diaminodiphenylsulfone, 4,4'-diaminodiphenylsulfone, 3,3'-diaminodiphenyl sulfide, 3,4'-diaminodiphenyl sulfide, 4,4'-diaminodiphenyl sulfide, 3,3'-diaminodiphenylketone, 3,4'-diaminodiphenylketone, 4,4'-diaminodiphenylketone, 2,2-bis(3-aminophenyl)propane, 2,2'-(3,4'-diaminodiphenyl)propane, 2,2-bis(4-aminophenyl)propane, 2,2-bis(3-aminophenyl)hexafluoropropane, 2,2-(3,4'-diaminodiphenyl)hexafluoropropane, 2,2-bis(4-aminophenyl)hexafluoropropane, 1,3-bis(3-aminophenoxy)benzene, 1,4-bis(3-aminophenoxy)benzene, 1,4-bis(4-aminophenoxy)benzene, 3,3'-(1,4-phenylenebis(1-methylethylidene))bisaniline, 3,4'-(1,4-phenylenebis(1-methylethylidene))bisaniline, 4,4'-(1,4-phenylenebis(1-methylethylidene))bisaniline, 2,2-bis(4-(3-aminophenoxy)phenyl)propane, 2,2-bis(4-(3-aminophenoxy)phenyl)hexafluoropropane, 2,2-bis(4-(4-aminophenoxy)phenyl)hexafluoropropane, bis(4-(3-aminophenoxy)phenyl)sulfide, bis(4-(4-aminophenoxy)phenyl)sulfide, bis(4-(3-aminophenoxy)phenyl)sulfone, bis(4-(4-aminophenoxy)phenyl)sulfone, 1,3-bis(aminomethyl)cyclohexane and 2,2-bis(4-aminophenoxyphenyl)propane.

A tetracarboxylic dianhydride used as a starting material for synthesize of the polyimide is preferably purified by recrystallization from acetic anhydride in order to limit reduction in the properties of the adhesive. Alternatively, the tetracarboxylic dianhydride may be dried by heating for 12 hours or longer at a temperature 10-20° C. lower than its melting point. The purity of the tetracarboxylic dianhydride can be evaluated by the difference between the endothermic starting temperature and the endothermic peak temperature as measured with a differential scanning calorimeter (DSC), and preferably a tetracarboxylic dianhydride purified by recrystallization or drying so that the difference is not greater than 20° C. and more preferably not greater than 10° C. is used for synthesis of the polyimide. The endothermic starting temperature and endothermic peak temperature are measured using a DSC (Model DSC-7 by Perkin-Elmer), under conditions with a sample amount of 5 mg, a temperature-elevating rate of 5° C./min and a measuring atmosphere of nitrogen.

As examples of tetracarboxylic dianhydrides there may be mentioned pyromellitic acid dianhydride, 3,3',4,4'-biphenyltetracarboxylic dianhydride, 2,2',3,3'-biphenyltetracarboxylic dianhydride, 2,2-bis(3,4-dicarboxyphenyl)propane dianhydride, 2,2-bis(2,3-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)methane dianhydride, bis(3,4-dicarboxyphenyl)sulfone dianhydride, 3,4,9,10-perylenetetracarboxylic dianhydride, bis(3,4-dicarboxyphenyl)ether dianhydride, benzene-1,2,3,4-tetracarboxylic dianhydride, 3,4,3',4'-benzophenonetetracarboxylic dianhydride, 2,3,2',3'-benzophenonetetracarboxylic dianhydride, 3,3,3',4'-benzophenonetetracarboxylic dianhydride, 1,2,5,6-naphthalenetetracarboxylic dianhydride, 1,4,5,8-naphthalenetetracarboxylic dianhydride, 2,3,6,7-naphthalenetetracarboxylic dianhydride, 1,2,4,5-naphthalenetetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, thiophene-2,3,5,6-tetracarboxylic dianhydride, 2,3,3',4'-biphenyltetracarboxylic dianhydride, 3,4,3',4'-biphenyltetracarboxylic dianhydride, 2,3,2',3'-biphenyltetracarboxylic dianhydride, bis(3,4-dicarboxyphenyl)dimethylsilane dianhydride, bis(3,4-dicarboxyphenyl)methylphenylsilane dianhydride, bis(3,4-dicarboxyphenyl)diphenylsilane dianhydride, 1,4-bis(3,4-dicarboxyphenyldimethylsilyl)benzene dianhydride, 1,3-bis(3,4-dicarboxyphenyl)-1,1,3,3-tetramethyldicyclohexane dianhydride, p-phenylenebis(trimellitateanhydride), ethylenetetracarboxylic dianhydride, 1,2,3,4-butanetetracarboxylic dianhydride, decahydronaphthalene-1,4,5,8-tetracarboxylic dianhydride, 4,8-dimethyl-1,2,3,5,6,7-hexahydronaphthalene-1,2,5,6-tetracarboxylic dianhydride, cyclopentane-1,2,3,4-tetracarboxylic dianhydride, pyrrolidine-2,3,4,5-tetracarboxylic dianhydride, 1,2,3,4-cyclobutanetetracarboxylic dianhydride, bis(exo-bicyclo[2,2,1]heptane-2,3-dicarboxylic dianhydride, bicyclo-[2,2,2]-oct-7-ene-2,3,5,6-tetracarboxylic dianhydride, 2,2-bis(3,4-dicarboxyphenyl)propane dianhydride, 2,2-bis[4-(3,4-dicarboxyphenyl)phenyl]propane dianhydride, 2,2-bis(3,4-dicarboxyphenyl)hexafluoropropane dianhydride, 2,2-bis[4-(3,4-dicarboxyphenyl)phenyl]hexafluoropropane dianhydride, 4,4'-bis(3,4-dicarboxyphenoxy)diphenyl sulfide dianhydride, 1,4-bis(2-hydroxyhexafluoroisopropyl)benzenebis(trimellitic anhydride), 1,3-bis(2-hydroxyhexafluoroisopropyl)benzenebis(trimellitic anhydride), 5-(2,5-dioxotetrahydrofuryl)-3-methyl-3-cyclohexene-1,2-dicarboxylic dianhydride and tetrahydrofuran-2,3,4,5-tetracarboxylic dianhydride.

Particularly preferred are tetracarboxylic dianhydrides represented by the following chemical formulas (V) and (VI), in order to impart satisfactory solubility in solvents. In this case, the proportion of the tetracarboxylic dianhydride represented by these formulas is preferably at least 50 mol % with respect to 100 mol % as the total tetracarboxylic dianhydride. A proportion of less than 50 mol % will tend to reduce the solubility-improving effect.

[Chemical Formula 5]

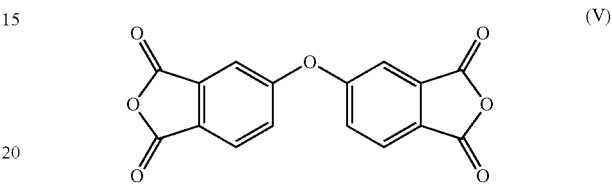

(V)

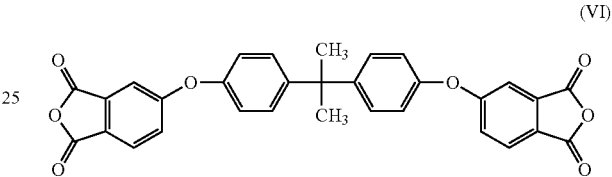

(VI)

These tetracarboxylic dianhydrides may be used alone or in combinations of two or more. For adjustment of the solubility in alkali developing solutions and the molecular weight, a monofunctional acid anhydride such as trimellitic anhydride may also be combined therewith if necessary.

A radiation-polymerizable compound is a compound that polymerizes by irradiation with radiation such as ultraviolet rays or an electron beam. The radiation-polymerizable compound is preferably a compound with an ethylenic unsaturated group such as an acrylate or methacrylate group. As specific examples of radiation-polymerizable compounds there may be mentioned methyl acrylate, methyl methacrylate, ethyl acrylate, ethyl methacrylate, butyl acrylate, butyl methacrylate, 2-ethylhexyl acrylate, 2-ethylhexyl methacrylate, pentenyl acrylate, tetrahydrofurfuryl acrylate, tetrahydrofurfuryl methacrylate, diethyleneglycol diacrylate, triethyleneglycol diacrylate, tetraethyleneglycol diacrylate, diethyleneglycol dimethacrylate, triethyleneglycol dimethacrylate, tetraethyleneglycol dimethacrylate, trimethylolpropane diacrylate, trimethylolpropane triacrylate, trimethylolpropane dimethacrylate, trimethylolpropane trimethacrylate, 1,4-butanediol diacrylate, 1,6-hexanediol diacrylate, 1,4-butanediol dimethacrylate, 1,6-hexanediol dimethacrylate, pentaerythritol triacrylate, pentaerythritol tetraacrylate, pentaerythritol trimethacrylate, pentaerythritol tetramethacrylate, dipentaerythritol hexaacrylate, dipentaerythritol hexamethacrylate, styrene, divinylbenzene, 4-vinyltoluene, 4-vinylpyridine, N-vinylpyrrolidone, 2-hydroxyethyl acrylate, 2-hydroxyethyl methacrylate, 1,3-acryloyloxy-2-hydroxypropane, 1,2-methacryloyloxy-2-hydroxypropane, methylenebisacrylamide, N,N-dimethylacrylamide, N-methylolacrylamide, triacrylate of tris(β-hydroxyethyl)isocyanurate, compounds represented by the following general formula (10), urethane acrylates or urethane methacrylates, and urea acrylates. In formula (10), $R^3$ and $R^4$ each independently represent hydrogen or a methyl group, and q and r each independently represent an integer of 1 or greater.

[Chemical Formula 6]

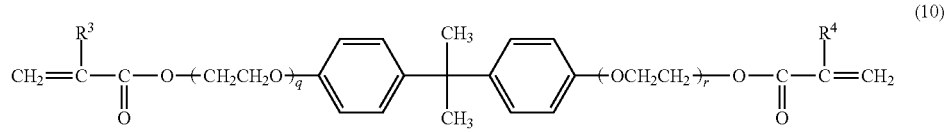

(10)

Urethane acrylates and urethane methacrylates are produced, for example, by reaction of diols, isocyanate compounds represented by the following general formula (21) and compounds represented by the following general formula (22).

[Chemical Formula 7]

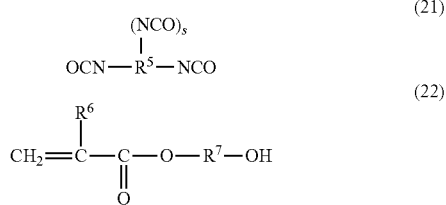

In formula (21), s represents 0 or 1 and $R^5$ represents a C1-30 divalent or trivalent organic group. In formula (22), $R^6$ represents hydrogen or a methyl group, and $R^7$ represents an ethylene or propylene group.

A urea methacrylate is produced, for example, by reaction of a diamine represented by the following general formula (31) and a compound represented by the following general formula (32).

[Chemical Formula 8]

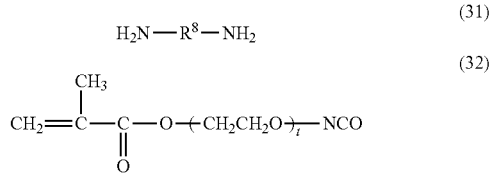

In formula (31), $R^8$ represents a C2-30 divalent organic group. In formula (32), t represents 0 or 1.

In addition to these compounds, there may be used radiation-polymerizable copolymers having ethylenic unsaturated groups on side chains, which are obtained by addition reaction of a compound having at least one ethylenic unsaturated group and a functional group such as an oxirane ring or an isocyanate, hydroxyl or carboxyl group, with a functional group-containing vinyl copolymer.

These radiation-polymerizable compounds may be used alone or in combinations of two or more. Among them, radiation-polymerizable compounds represented by general formula (10) above are preferred from the standpoint of imparting solvent resistance after curing, and urethane acrylates and urethane methacrylates are preferred from the standpoint of imparting flexibility after curing.

The molecular weight of the radiation-polymerizable compound is preferably not greater than 2000. A molecular weight of greater than 2000 will tend to lower the solubility of the photosensitive adhesive in alkali developing solutions, while also lowering the tack of the adhesive film and hampering low temperature attachment to adherends such as semiconductor wafers.

The radiation-polymerizable compound content is preferably 5-250 parts by mass and more preferably 20-200 parts by mass with respect to 100 parts by mass of the alkali-soluble polymer. A radiation-polymerizable compound content of greater than 250 parts by mass will tend to lower the adhesion after thermocompression bonding and increase warping, as a result of the polymerized radiation-polymerizable compound. A content of less than 5 parts by mass will tend to lower the solvent resistance after light exposure, thus interfering with formation of the pattern.

A heat radical generator may be used if necessary to increase the thermosetting property after light exposure and re-adhesion.

The photopolymerization initiator preferably has an absorption band of 300-400 nm in order to improve the sensitivity during pattern formation. As specific examples of photopolymerization initiators there may be mentioned aromatic ketones such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzyl-2-dimethylamino-1-(4-morpholinophenyl)-butanone-1,2,2-dimethoxy-1,2-diphenylethan-1-one, 1-hydroxy-cyclohexyl-phenyl-ketone, 2-methyl-1-(4-(methylthio)phenyl)-2-morpholinopropanone-1,2,4-diethylthioxanthone, 2-ethylanthraquinone and phenanthrenequinone, benzoinethers such as benzoinmethyl ether, benzomethyl ether and benzoinphenyl ether, benzoins such as methylbenzoin and ethylbenzoin, benzyl derivatives such as benzyldimethylketal, 2,4,5-triarylimidazole dimers such as 2-(o-chlorophenyl)-4,5-diphenylimidazole dimer, 2-(o-chlorophenyl)-4,5-di(m-methoxyphenyl) imidazole dimer, 2-(o-fluorophenyl)-4,5-phenylimidazole dimer, 2-(o-methoxyphenyl)-4,5-diphenylimidazole dimer, 2-(p-methoxyphenyl)-4,5-diphenylimidazole dimer, 2,4-di (p-methoxyphenyl)-5-phenylimidazole dimer and 2-(2,4-dimethoxyphenyl)-4,5-diphenylimidazole dimer, acridine derivatives such as 9-phenylacridine and 1,7-bis(9,9'-acridinyl)heptane, and bisacylphosphine oxides such as bis(2,6-dimethoxybenzoyl)-2,4,4-trimethyl-pentylphosphine oxide and bis(2,4,6,-trimethylbenzoyl)-phenylphosphine oxide. These may be used alone or in combinations of two or more.

The amount of the photopolymerization initiator is not particularly restricted, but it may usually be 0.01-30 parts by mass with respect to 100 parts by mass of the alkali-soluble polymer.

The photosensitive adhesive preferably further comprises a thermosetting resin. A thermosetting resin, for the purpose of the present specification, is a reactive compound that can undergo crosslinking reaction by heat. As examples of such compounds there may be mentioned epoxy resins, cyanate resins, bismaleimide resins, phenol resins, urea resins, melamine resins, alkyd resins, acrylic resins, unsaturated polyester resins, diallyl phthalate resins, silicone resins, resorcinol-formaldehyde resins, xylene resins, furan resins, polyurethane resins, ketone resins, triallyl cyanurate resins, polyisocyanate resins, tris(2-hydroxyethyl)isocyanurate-containing resins, triallyl trimellitate-containing resins, thermosetting resins synthesized from cyclopentadienes, and thermosetting resins obtained by trimerization of aromatic dicyanamides. Among these, epoxy resins, cyanate resins and bismaleimide resins are preferred from the viewpoint of imparting excellent adhesive force at high temperature, and epoxy resins are particularly preferred for their manageability and their thermal reactivity in context of the thermal history during assembly of semiconductor devices. These thermosetting resins may be used alone or in combinations of two or more.

The epoxy resin is preferably a compound with at least two epoxy groups in the molecule. From the viewpoint of curability and cured properties, it is extremely preferably a phenol glycidyl ether-type epoxy resin. As examples of such epoxy resins there may be mentioned glycidyl ethers of bisphenol A, AD, S or F, glycidyl ether of hydrogenated bisphenol A, glycidyl ethers of bisphenol A ethylene oxide adducts, glycidyl ethers of bisphenol A propylene oxide adducts, glycidyl ethers of phenol-novolac resins, glycidyl ethers of cresol-novolac resins, glycidyl ethers of bisphenol A-novolac resins, glycidyl ethers of naphthalene resins, trifunctional or tetrafunctional glycidyl ethers, glycidyl ethers of dicyclopentadienephenol resins, glycidyl esters of dimer acids, trifunctional or tetrafunctional glycidylamines, and glycidylamines of naphthalene resins. These may be used alone or in combinations of two or more.

As examples of cyanate resins there may be mentioned 2,2'-bis(4-phenyl cyanate)isopropylidene, 1,1'-bis(4-phenyl cyanate)ethane, bis(4-cyanate-3,5-dimethylphenyl)methane, 1,3-bis[4-phenyl cyanate-1-(1-methylethylidene)]benzene, cyanate phenol-dicyclopentanediene adducts, phenol novolac cyanate ester, bis(4-phenyl cyanate)thioether, bis(4-phenyl cyanate)ether, resorcinol dicyanate, 1,1,1-tris(4-phenyl cyanate)ethane and 2-phenyl-2-(4-phenyl cyanate)isopropylidene. These may be used alone or in combinations of two or more.

As examples of bismaleimide resins there may be mentioned o-, m- or p-bismaleimidebenzene, 4-bis(p-maleimidecumyl)benzene, 1,4-bis(m-maleimidecumyl)benzene, and maleimide compounds represented by the following general formulas (40), (41), (42) and (43). These may be used alone or in combinations of two or more.

[Chemical Formula 9]

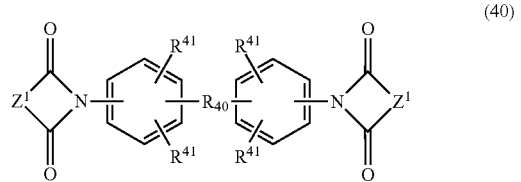
(40)

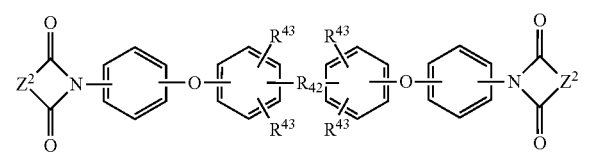
(41)

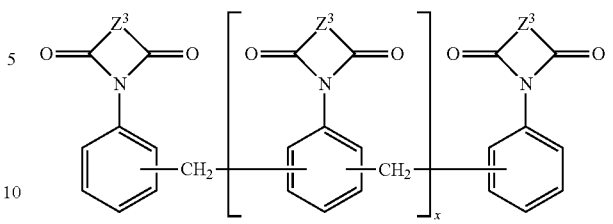
(42)

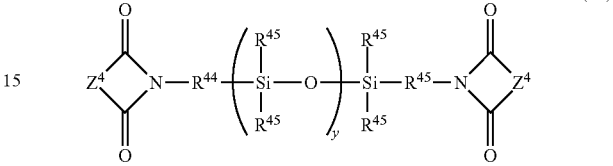
(43)

In formula (40), $R^{40}$ represents —O—, —CH$_2$—, —CF$_2$—, —SO$_2$—, —S—, —CO—, —C(CH$_3$)$_2$— or —C(CF$_3$)$_2$—, the four $R^{41}$ groups each independently represent hydrogen, lower alkyl, lower alkoxy, fluorine, chlorine or bromine, and the two $Z^1$ groups each independently represent a dicarboxylic acid residue with an ethylenic unsaturated double bond.

In formula (41), $R^{42}$ represents —O—, —CH$_2$—, —CF$_2$—, —SO$_2$—, —S—, —CO—, —C(CH$_3$)$_2$— or —C(CF$_3$)$_2$—, the four $R^{43}$ groups each independently represent hydrogen, lower alkyl, lower alkoxy, fluorine, chlorine or bromine, and the two $Z^2$ groups each independently represent a dicarboxylic acid residue with an ethylenic unsaturated double bond.

In formula (42), x represents an integer of 0-4, and the multiple $Z^3$ groups each independently represent a dicarboxylic acid residue with an ethylenic unsaturated double bond.

In formula (43), the two $R^{44}$ groups each independently represent a divalent hydrocarbon group, the multiple $R^{45}$ groups each independently represent a monovalent hydrocarbon group, the two $Z^4$ groups each independently represent a dicarboxylic acid residue with an ethylenic unsaturated double bond, and y represents an integer of 1 or greater.

$Z^1$, $Z^2$, $Z^3$ and $Z^4$ in formulas (40)-(43) may be maleate residues, citraconate residues or the like.

As examples of bismaleimide resins represented by formula (41) there may be mentioned 4,4-bismaleimidediphenyl ether, 4,4-bismaleimidediphenyl methane, 4,4-bismaleimide-3,3'-dimethyl-diphenyl methane, 4,4-bismaleimidediphenyl sulfone, 4,4-bismaleimidediphenyl sulfide, 4,4-bismaleimidediphenylketone, 2'-bis(4-maleimidephenyl)propane, 4-bismaleimidediphenyl fluoromethane and 1,1,1,3,3,3-hexafluoro-2,2-bis(4-maleimidephenyl)propane.

As examples of bismaleimide resins represented by formula (42) there may be mentioned bis[4-(4-maleimidephenoxy)phenyl]ether, bis[4-(4-maleimidephenoxy)phenyl]methane, bis[4-(4-maleimidephenoxy)phenyl]fluoromethane, bis[4-(4-maleimidephenoxy)phenyl]sulfone, bis[4-(3-maleimidephenoxy)phenyl]sulfone, bis[4-(4-maleimidephenoxy)phenyl]sulfide, bis[4-(4-maleimidephenoxy)phenyl]ketone, 2-bis[4-(4-maleimidephenoxy)phenyl]propane and 1,1,1,3,3,3-hexafluoro-2,2-bis[4-(4-maleimidephenoxy)phenyl]propane.

When a thermosetting resin is used, additives such as curing agents, curing accelerators and catalysts may be appropriately added to the photosensitive adhesive for curing. When a catalyst is added, a co-catalyst may also be used if necessary.

When an epoxy resin is used, it is preferred to use a curing agent or curing accelerator for the epoxy resin, and more preferably they are used in combination. As examples of curing agents there may be mentioned phenol-based compounds, aliphatic amines, alicyclic amines, aromatic polyamines, polyamides, aliphatic acid anhydrides, alicyclic acid anhydrides, aromatic acid anhydrides, dicyandiamides, organic acid dihydrazides, boron trifluoride amine complexes, imidazoles, tertiary amines, and phenol-based compounds having at least two phenolic hydroxyl groups in the molecule. Of these, phenol-based compounds having at least two phenolic hydroxyl groups in the molecule are preferred from the viewpoint of excellent solubility in alkali developing solutions.

As examples of phenol-based compounds having at least two phenolic hydroxyl groups in the molecule there may be mentioned phenol-novolac resins, cresol-novolac resins, t-butylphenol-novolac resins, dicyclopentadienecresol-novolac resins, dicyclopentadienephenol-novolac resins, xylylene-modified phenol-novolac resins, naphthol-novolac resins, trisphenol-novolac resins, tetrakisphenol-novolac resins, bisphenol A-novolac resins, poly-p-vinylphenol resins and phenolaralkyl resins.

The curing accelerator is not particularly restricted so long as it accelerates curing of the epoxy resin, and as examples there may be mentioned imidazoles, dicyandiamide derivatives, dicarboxylic acid dihydrazides, triphenylphosphine, tetraphenylphosphonium tetraphenyl borate, 2-ethyl-4-methylimidazole-tetraphenyl borate and 1,8-diazabicyclo[5.4.0]undecene-7-tetraphenyl borate.

The amount of epoxy resin curing agent used is preferably 0-200 parts by mass with respect to 100 parts by mass of the epoxy resin, and the amount of curing accelerator is preferably 0-50 parts by mass with respect to 100 parts by mass of the epoxy resin.

When a cyanate resin is used as the thermosetting resin, it is preferred to use a catalyst, and a co-catalyst as necessary. As examples of catalysts there may be mentioned metal salts and metal complexes of cobalt, zinc, copper and the like, and preferred co-catalysts include phenol-based compounds such as alkylphenols, bisphenol compounds and phenol-novolac resins.

When a bismaleimide resin is used as the thermosetting resin, it is preferred to use a radical polymerizing agent as the curing agent. As examples of radical polymerizing agents there may be mentioned acetylcyclohexylsulfonyl peroxide, isobutyryl peroxide, benzoyl peroxide, octanoyl peroxide, acetyl peroxide, dicumyl peroxide, cumene hydroperoxide and azobisisobutyronitrile. The amount of radical polymerizing agent used in this case is preferably 0.01-1.0 part by mass with respect to 100 parts by mass of the bismaleimide resin.

The photosensitive adhesive may contain a suitable coupling agent for purposes such as increased bonding strength. Silane coupling agents and titanium-based coupling agents may be mentioned as examples of coupling agents, with silane coupling agents being preferred from the viewpoint of imparting high adhesive force.

When a coupling agent is used, the amount is preferably 0-50 parts by mass and more preferably 0-20 parts by mass with respect to 100 parts by mass of the polyimide. An amount exceeding 50 parts by mass will tend to reduce the shelf life of the photosensitive adhesive.

As examples of silane coupling agents there may be mentioned vinyltrimethoxysilane, vinyltriethoxysilane, vinyltris(2-methoxyethoxy)silane, N-(2-aminoethyl) 3-aminopropylmethyldimethoxysilane, N-(2-aminoethyl) 3-aminopropyltrimethoxysilane, 3-aminopropyltriethoxysilane, 3-aminopropyltrimethoxysilane, 3-glycidoxypropyltrimethoxysilane, 3-glycidoxypropylmethyldimethoxysilane, 2-(3,4-epoxycyclohexyl)ethyltrimethoxysilane, 3-isocyanatepropyltriethoxysilane, 3-methacryloxypropyltrimethoxysilane, 3-mercaptopropyltrimethoxysilane, 3-ureidopropyltriethoxysilane, N-(1,3-dimethylbutylidene)-3-(triethoxysilyl)-1-propaneamine, N,N'-bis[3-(trimethoxysilyl)propyl]ethylenediamine, polyoxyethylenepropyltrialkoxysilane and polyethoxydimethylsiloxane. These may be used alone or in combinations of two or more.

The photosensitive adhesive may contain a filler. As examples of fillers there may be mentioned metal fillers such as silver powder, gold dust and copper powder, non-metal inorganic fillers such as silica, alumina, boron nitride, titania, glass, iron oxide, aluminum borate and ceramics, and organic fillers such as carbon and rubber-based fillers.

The filler may be selected for use according to the desired function. For example, a metal filler is added to impart conductivity or a thixotropic property to an adhesive film, a non-metal inorganic filler is added to impart low thermal expansion and low hygroscopic properties to an adhesive film, and an organic filler is added to impart toughness to an adhesive film. These metal fillers, non-metal inorganic fillers and organic fillers may be used alone or in combinations of two or more. In cases where a filler is used, mixing and kneading may be accomplished using an appropriate combination of dispersers such as an ordinary stirrer, kneader, triple roll, ball mill or the like.

When a filler is used, the amount is preferably not greater than 1000 parts by mass and more preferably not greater than 500 parts by mass with respect to 100 parts by mass of the alkali-soluble polymer. The lower limit is not particularly restricted but will normally be 1 part by mass. If the filler amount exceeds 1000 parts by mass, the adhesion will tend to be reduced.

The storage elastic modulus of the photosensitive adhesive at 100° C. after light exposure is preferably 0.01-10 MPa. A storage elastic modulus of less than 0.01 MPa will lower resistance to the heat and pressure applied during thermocompression bonding after pattern formation, thus tending to result in crushing of the pattern, while a storage elastic modulus of greater than 10 MPa will lower the re-adhesion property after light exposure, thus tending to increase the temperature required to obtain sufficient adhesive force during thermocompression bonding onto adherends after pattern formation.

The value of the storage elastic modulus can be obtained by measuring the dynamic viscoelasticity of a test piece composed of the light-exposed photosensitive adhesive. The dynamic viscoelasticity is measured under conditions with a temperature-elevating rate of 5° C./min, a frequency of 1 Hz and a measuring temperature of −50° C. to 200° C. The measuring apparatus used may be an RSA-2 Viscoelasticity Analyzer by Rheometrix, for example.

The test piece for dynamic viscoelasticity measurement is typically prepared as follows. First, an adhesive sheet comprising a PET film and an adhesive film with a thickness of approximately 40 μm formed on one surface thereof, is cut to a size of 35 mm×10 mm, and is irradiated with ultraviolet rays from the PET film side using a high precision parallel light exposure device (ORC Manufacturing Co., Ltd.), under conditions with an light exposure dose of 1000 mJ/cm$^2$. Following light exposure, the PET film is peeled off and the test piece is thus obtained.

The storage elastic modulus of the photosensitive adhesive at 260° C. after light exposure and heat curing is preferably 1 MPa or greater. If the storage elastic modulus is less than 1 MPa, it will tend to be difficult to inhibit peeling or destruction during high temperature heating when the semiconductor device obtained using the photosensitive adhesive is mounted on a board by soldering.

The value of the storage elastic modulus can be obtained by measuring the dynamic viscoelasticity of a test piece composed of the light-exposed and heat-cured photosensitive adhesive. The dynamic viscoelasticity is measured under conditions with a temperature-elevating rate of 5° C./min, a frequency of 1 Hz and a measuring temperature of −50° C. to 300° C. The measuring apparatus used may be an RSA-2 Viscoelasticity Analyzer by Rheometrix, for example.

A test piece for measurement of the dynamic viscoelasticity is typically obtained by heat curing the adhesive film in an oven at 160° C. for 3 hours after it has been exposed under the same conditions as those mentioned above for formation of the test piece for dynamic viscoelasticity measurement after light exposure.

The temperature at which the weight reduction of the photosensitive adhesive in thermogravimetric analysis after light exposure and heat curing is 5% (hereunder referred to as "5% weight reduction temperature") is preferably 260° C. or higher. If the 5% weight reduction temperature is below 260° C., it will tend to be difficult to inhibit peeling or destruction during high temperature heating when the semiconductor device obtained using the photosensitive adhesive is mounted on a board by soldering. It will also increase the possibility of contaminating the surrounding material or parts by volatile components generated during heating.

The 5% weight reduction temperature is the temperature at which the weight reduction relative to the initial weight is 5% in thermogravimetric analysis performed under conditions with a temperature-elevating rate of 10° C./min, an air flow rate or 80 mL/min and a measuring temperature of 40° C. to 400° C. The sample for thermogravimetric analysis is prepared by using a mortar to finely crush a light-exposed and heated adhesive film under the same conditions as those described for the storage elastic modulus after light exposure and heat curing. The measuring device used may be an EXSTAR 6300 Simultaneous Thermogravimetric Differential Thermal Analyzer by SII Nanotechnology, Inc., for example.

The properties mentioned above can be achieved by preparing the photosensitive adhesive using the polyimide, radiation-polymerizable compound and photopolymerization initiator, and the thermosetting resin and filler if necessary, and adjusting their types and blending ratio.

The photosensitive adhesive film (adhesive film) can be obtained by, for example, a method in which the alkali-soluble polymer, radiation-polymerizable compound, photopolymerization initiator and if necessary other components are mixed in an organic solvent and the mixture is kneaded to prepare a varnish, the varnish layer is formed on a base, and then the varnish layer is dried by heating and the base removed if necessary.

The mixing and kneading can be accomplished by an appropriate combination of dispersing machines such as an ordinary stirrer, kneader, triple roll or ball mill. When a thermosetting resin is used, the drying is carried out at a temperature so that the thermosetting resin does not completely react during drying, and under conditions at which the solvent completely volatilizes. Specifically, the varnish layer is dried by heating, usually at 60-180° C. for 0.1-90 minutes.

The temperature at which the thermosetting resin does not completely react is, specifically, a temperature below the peak temperature for heat of reaction, with measurement using a DSC (for example, a "Model DSC-7" (trade name) by Perkin-Elmer), with a sample amount of 10 mg, a temperature-elevating rate of 5° C./min and a measuring atmosphere of air.

The organic solvent used to prepare the varnish, i.e. the varnish solvent, is not particularly restricted so long as it can uniformly dissolve or disperse the material. As examples there may be mentioned dimethylformamide, toluene, benzene, xylene, methyl ethyl ketone, tetrahydrofuran, ethylcellosolve, ethylcellosolve acetate, dioxane, cyclohexanone, ethyl acetate and N-methyl-pyrrolidinone.

The thickness of the varnish layer is preferably 1-100 μm. A thickness of less than 1 μm will tend to impair the adherend anchoring function, while a thickness of greater than 100 μm will tend to increase the residual volatile components in the obtained adhesive film 1.

The residual volatile content in the adhesive film is preferably not greater than 10% by mass. A residual volatile content of greater than 10% will tend to result in more residual voids in the interior of the adhesive film due to foam formation by volatilization of the solvent during the heating for assembly, thus lowering the moisture-proof reliability. It will also increase the possibility of contaminating the surrounding material or parts by volatile components generated during heating. The residual volatilizing content is calculated by the formula: residual volatile content (% by mass)=$\{(M2-M1)/M1\}\times 100$, where M1 is the initial mass of the adhesive film cut to a size of 50 mm×50 mm, and M2 is the mass of the adhesive film after it has been heated for 3 hours in an oven at 160° C.

The base used to form the adhesive film is not particularly restricted so long as it can withstand the drying conditions. For example, a polyester film, polypropylene film, polyethylene terephthalate film, polyimide film, polyetherimide film, polyether naphthalate film or methylpentene film may be used as the base. A film used as the base may also be a multilayer film comprising a combination of two or more different types, and the surface may be treated with a silicone-based or silica-based release agent.

The invention claimed is:

1. A method for manufacturing a semiconductor device, comprising:
    a first step of providing a photosensitive adhesive on a first adherend having a first connection section;
    a second step of patterning the photosensitive adhesive by light exposure and development so that openings are formed where the first connection section is exposed;
    a third step of filling the openings with a conductive material to form a conductive layer; and
    a fourth step of directly bonding a second adherend having a second connection section to the photosensitive adhesive while electrically connecting the first connection section and second connection section by the conductive layer.

2. The method for manufacturing a semiconductor device according to claim 1, wherein
    either the first adherend or second adherend is a semiconductor wafer composed of a plurality of semiconductor chips while the other is a board, and
    either between the third step and fourth step or after the fourth step, a dicing step is further provided in which the semiconductor wafer is diced into the semiconductor chips.

3. The method for manufacturing a semiconductor device according to claim 1, wherein the photosensitive adhesive contains an alkali-soluble polymer, a radiation-polymerizable compound and a photopolymerization initiator.

4. The method for manufacturing a semiconductor device according to claim 3, wherein the alkali-soluble polymer contains a carboxyl or phenolic hydroxyl group.

5. The method for manufacturing a semiconductor device according to claim 3, wherein a glass transition temperature of the alkali-soluble polymer is not greater than 150° C.

6. The method for manufacturing a semiconductor device according to claim 3, wherein the alkali-soluble polymer is a polyimide.

7. The method for manufacturing a semiconductor device according to claim 6, wherein the polyimide is a polyimide obtained by reacting a tetracarboxylic dianhydride with a diamine including at least one type of aromatic diamine represented by any of the following chemical formulas (I-a), (I-b), (II-a), (II-b) and (II-c)

[Chemical Formula 1]

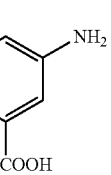
(I-a)

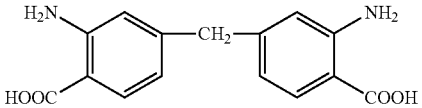
(I-b)

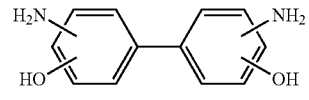
(II-a)

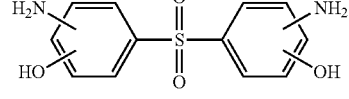
(II-b)

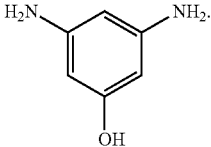
(II-c)

8. The method for manufacturing a semiconductor device according to claim 3, wherein the photosensitive adhesive further comprises a thermosetting resin.

9. A photosensitive adhesive for use in the method for manufacturing a semiconductor device according to claim 1, wherein the photosensitive adhesive is in the form of a film.

10. A semiconductor device obtained by the method for manufacturing a semiconductor device according to claim 1.

* * * * *